(12) United States Patent
Kaiser, Jr.

(10) Patent No.: US 7,196,566 B2
(45) Date of Patent: Mar. 27, 2007

(54) HIGH-RESOLUTION VARIABLE ATTENUATION DEVICE

(75) Inventor: Joseph A. Kaiser, Jr., Hopkinton, MA (US)

(73) Assignee: LTX Corporation, Norwood, MA (US)

( * ) Notice: Subject to any disclaimer, the term of this patent is extended or adjusted under 35 U.S.C. 154(b) by 0 days.

(21) Appl. No.: 10/698,299

(22) Filed: Oct. 31, 2003

(65) Prior Publication Data

US 2005/0093606 A1 May 5, 2005

(51) Int. Cl.
*H03L 5/00* (2006.01)
(52) U.S. Cl. ..................... 327/308; 333/81 R
(58) Field of Classification Search ............... 327/308, 327/365, 403, 404, 405, 407, 408, 415, 416, 327/417; 331/81 R
See application file for complete search history.

(56) References Cited

U.S. PATENT DOCUMENTS 1,975,709 A * 10/1934 Blumlein .................. 333/81 R
3,015,790 A * 1/1962 Eisaman et al. .......... 333/81 R
4,952,893 A * 8/1990 Cuddy ...................... 333/81 R
5,347,239 A * 9/1994 Loehner et al. ........... 333/81 R
6,472,948 B1 * 10/2002 Kyriakos et al. ......... 333/81 R

* cited by examiner

*Primary Examiner*—Kenneth B. Wells
(74) *Attorney, Agent, or Firm*—Holland & Knight LLP; Brian J. Colandreo (57) ABSTRACT

A variable attenuation device includes a resistive array having two or more input nodes, two or more output nodes, and two or more resistive devices for coupling the input nodes and the output nodes. A first switch has an input terminal and two or more selectable output terminals, such that the input terminal is configured to receive an input signal and the two or more selectable output terminals are coupled to the two or more input nodes of the resistive array. A second switch has two or more selectable input terminals and an output terminal, such that the output terminal is configured to provide an attenuated output signal and the two or more selectable input terminals are coupled to the two or more output nodes of the resistive array. The output terminal selected on the first switch and the input terminal selected on the second switch varies the resistance seen by the input signal, and the values of the two or more resistive devices are configured to allow for substantially-uniform attenuation steps of the input signal.

26 Claims, 10 Drawing Sheets

HIGH-RESOLUTION VARIABLE ATTENUATION DEVICE

FIELD OF THE INVENTION

This invention relates to attenuators and, more particularly, to digital planar RF attenuators.

BACKGROUND

When verifying the proper operation of circuitry components, test equipment is often used to generate test signals that are provided to the components being tested. In order to ensure accurate verification, the characteristics of these test signals have to be controlled. Examples of these signal characteristics are signal type (e.g., DC, AC, sine wave, square wave, etc.), signal frequency, frequency sweep rate, signal amplitude, and amplitude sweep rate.

Variable attenuators are often used to control signal amplitude. Examples of these variable attenuators include voltage-variable analog attenuators, PIN-diode attenuators, and digital attenuators (e.g., switched-bit digital attenuators).

Voltage-variable analog attenuators typically include one or more field effect transistors that are controlled (via their gate voltage) to act like variable resistors in a series or a shunt configuration. PIN-diode attenuators typically forward bias a PIN diode so that they function as current-controlled resistors.

Voltage-variable attenuators and PIN-diode attenuators may be controlled digitally with the combination of a DAC (i.e., digital-to-analog converter) and an operational amplifier. Unfortunately, even with digital control, voltage-variable and PIN-diode attenuators provide non-linear performance, require time and cost to calibrate, and increase the parts count per attenuator unit.

While digital attenuators allow for direct digital control, these attenuators are typically too coarse, in that the highest-resolution achievable (i.e., the smallest amount of attenuation selectable) is between 0.25 and 0.50 decibels.

SUMMARY OF THE INVENTION

According to an aspect of this invention, a variable attenuation device includes a resistive array having two or more input nodes, two or more output nodes, and two or more resistive devices for coupling the input nodes and the output nodes. A first switch has an input terminal and two or more selectable output terminals, such that the input terminal is configured to receive an input signal and the two or more selectable output terminals are coupled to the two or more input nodes of the resistive array. A second switch has two or more selectable input terminals and an output terminal, such that the output terminal is configured to provide an attenuated output signal and the two or more selectable input terminals are coupled to the two or more output nodes of the resistive array. The output terminal selected on the first switch and the input terminal selected on the second switch varies the resistance seen by the input signal, and the values of the two or more resistive devices are configured to allow for substantially uniform attenuation steps of the input signal.

One or more of the following features may also be included. The first and/or second switch may include a discrete switching device (e.g., one or more discrete transistors or one or more transistors formed in a semiconductor substrate) coupled to each of the selectable output/input terminals. The input signal may be an RF signal.

The resistive devices may be discrete resistors, or formed with resistive material deposited on a semiconductor, dielectric, or insulating substrate. The resistive array may be a planar resistive array, which may be formed with resistive material deposited on a semiconductor, dielectric, or insulating substrate.

A first shunt resistance may couple the input terminal of the first switch to a ground, and a second shunt resistance may couple the output terminal of the second switch to the ground.

At least one of the resistive devices of the resistive array may connect two of the input nodes of the resistive array, or may connect one of the input nodes to one of the output nodes of the resistive array.

The first and second switches may be reflective switches.

According to a further aspect of this invention, a signal splitting system is provided by coupling a signal splitting device to the variable attenuation device described above. The signal splitting device is configured to receive an input signal on an input port and provide essentially equal output signals on each of a plurality of output ports,.

According to a further aspect of this invention, a signal attenuation system is provided by coupling a low-resolution signal attenuation device (e.g., a PIN diode attenuator or a voltage-variable analog attenuator) to the variable attenuation device described above. The low-resolution signal attenuation device is configured to receive an input signal on an input port and provide a coarsely-attenuated (e.g., 0.50 dB step) output signal on an output port, and the variable attenuation device is configured to allow for substantially-uniform fine attenuation steps (e.g., 0.05 dB) of the coarsely-attenuated output signal.

According to a further aspect of this invention, a testing system is provided by coupling a device-under-test to the variable attenuation device described above. The device-under-test includes an input port configured to receive a test signal that is provided by the variable attenuation device.

According to a further aspect of this invention, a dual-switch shunt variable attenuation device includes a resistive array having two or more input nodes, two or more output nodes, and two or more resistive devices for coupling the input nodes and the output nodes. A first switch has an input terminal and two or more selectable output terminals, such that the input terminal is configured to receive an input signal and the two or more selectable output terminals are coupled to the two or more input nodes of the resistive array. A second switch has two or more selectable input terminals and an output terminal, such that the output terminal is coupled to a ground and the two or more selectable input terminals are coupled to the two or more output nodes of the resistive array. The output terminal selected on the first switch and the input terminal selected on the second switch vary the resistance seen by the input signal, and the values of the two or more resistive devices are configured to allow for substantially-uniform attenuation steps of the input signal.

According to a further aspect of this invention, a single-switch shunt variable attenuation device includes a resistive array having two or more input nodes, two or more output nodes coupled to a ground, and two or more resistive devices for coupling the input nodes and the output nodes. A first switch has an input terminal and two or more selectable output terminals, such that the input terminal is configured to receive an input signal and the two or more selectable output terminals are coupled to the two or more input nodes of the resistive array. The output terminal selected on the first switch varies the resistance seen by the input signal, and the values of the two or more resistive devices are configured to allow for substantially-uniform attenuation steps of the input signal.

The details of one or more implementations are set forth in the accompanying drawings and the description below. Other features and advantages will become apparent from the description, the drawings, and the claims.

DETAILED DESCRIPTION OF THE PREFERRED EMBODIMENTS

Figure 1:
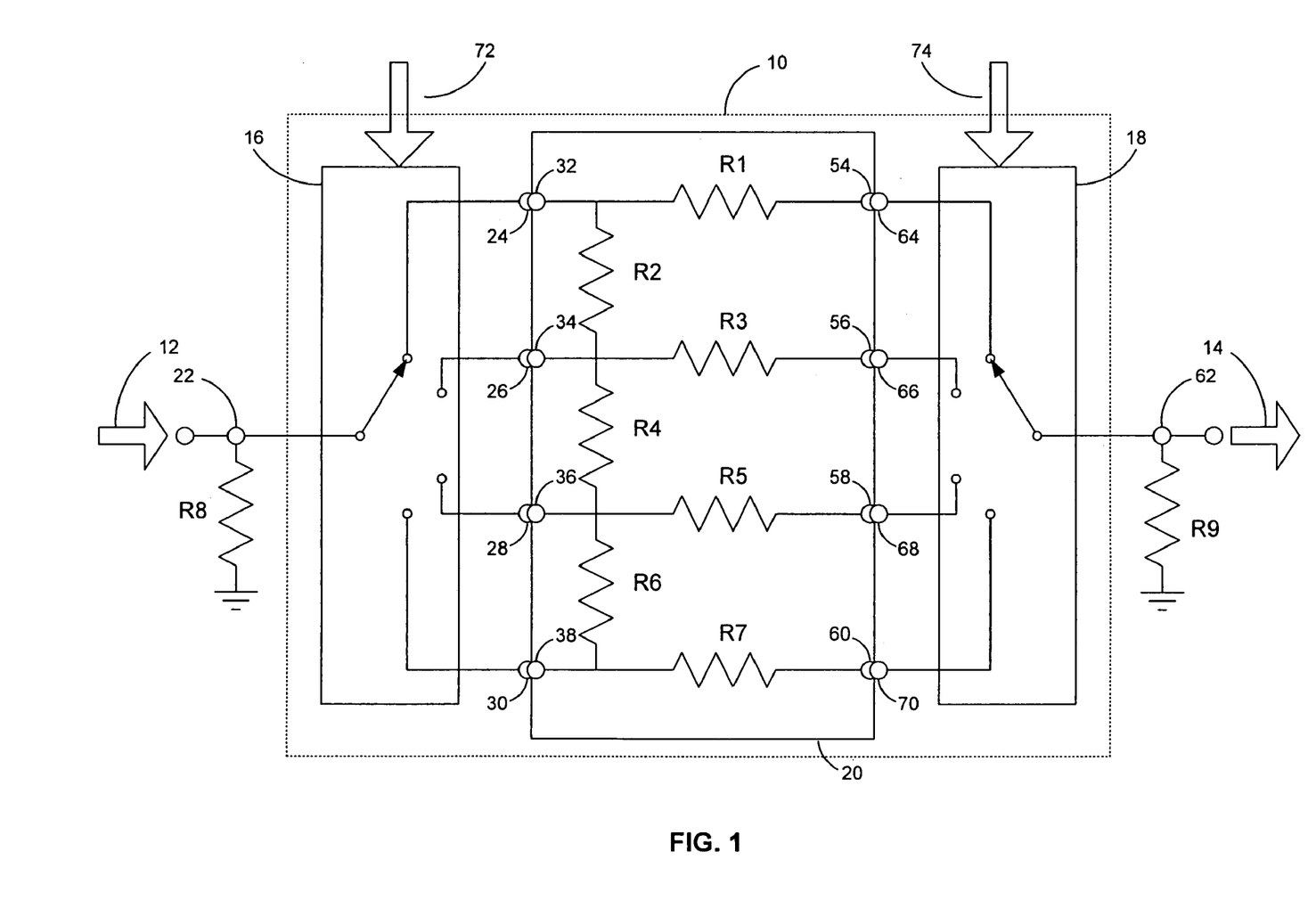
FIG. 1 is a block diagram of a series variable attenuation device.

Referring to FIG. 1, there is shown a variable attenuation device 10 for receiving a input signal 12, such as an RF (i.e., radio frequency) or microwave signal and providing an attenuated output signal 14. (030) Variable attenuation device 10 includes a first switch 16, a second switch 18, and a resistive array 20. As will be discussed below, by controlling the position of switches 16 and 18, the level of attenuation experienced by input signal 12 is controllable.

First switch 16 includes an input terminal 22 and four selectable output terminals 24, 26, 28 and 30. Output terminals 24, 26, 28 and 30 are coupled to the input nodes 32, 34, 36 and 38 of resistive array 20.

Resistive array 20 includes multiple resistors R1–R7 that provide resistive paths between input nodes 32, 34, 36 and 38 and output nodes 54, 56, 58 and 60 of resistive array 20. These resistors may be connected between an input and an output node (e.g., resistor R1), between input nodes (e.g., resistor R2), or between output nodes (not shown). Typically, resistive array 20 is a planar resistive array in which the various signal paths between input nodes 32, 34, 36 and 38 and output nodes 54, 56, 58 and 60 do not cross each other, thus reducing the possibility of deleterious effects at higher input signal frequencies.

Second switch 18 includes an output terminal 62 and four selectable input terminals 64, 66, 68 and 70 that are coupled to the output nodes 54, 56, 58 and 60 of resistive array 20.

Switches 16 and 18 are configured to receive control signals 72 and 74 (respectively), which are typically digital control signals (to be discussed below). Control signal 72 controls which of the output terminals 24, 26, 28 or 30 of first switch 16 are selected, and control signal 74 controls which of the input terminals 64, 66, 68 and 70 of second switch 18 are selected.

Switches 16 and 18 are typically reflective RF switches, as opposed to non-reflective RF switches. A non-reflective RF switch (also known as an absorptive RF switch) has internal load terminations that terminate any non-selected input or output terminals on the switch, thus absorbing any signal on that terminal. Conversely, reflective RF switches do not have internal load terminations and, therefore, non-selected input or output terminals float. This configuration prevents absorption and allows for reflection of the signal.

During operation of variable attenuation device 10, by manipulating the position of switches 16 and 18, the resistive load seen by input signal 12 can be varied. For example, if resistors R1, R2, R4, and R6 are 1.0 ohm resistors, resistor R3 is a 3.0 ohm resistor, resistor R5 is a 5.0 ohm resistor, and resistor R7 is a 7.0 ohm resistor, total resistances between 1.0 ohm and 10.0 ohms are possible. In this example, if input signal 12 is routed from input node 32 to output node 54 of resistive array 20, a resistive load of 1.0 ohm is realized. Alternatively, if input signal 12 is routed from input node 32 to output node 60, a resistive load of 10.0 ohms is realized.

By carefully choosing the value of resistors R1–R7, substantially uniform attenuation steps can be achieved. This is best explained with the following example. Concerning the four-way switch implementation described above and a desired 0.05 attenuation step, assume the resistors are chosen as follows: R1 is 0.593 ohms; R2 is 1.779 ohms; R3 is 1.779 ohms; R4 is 2.372 ohms; R5 is 2.965 ohms; R6 is 2.372 ohms; and R7 is 1.186 ohms. As this particular implementation uses four-way switches, there are $4^2$ or sixteen possible switch combinations, some of which result in duplicate load impedances.

| Path | Total Resistance ($Z_t$) | Attenuation (dB) | Delta (dB) | ABS value |
|---|---|---|---|---|
| R1 | 0.593 ohms | −0.05136 | −0.00136 | 0.00136 |
| R2 + R3 | 3.558 ohms | −0.30367 | −0.00367 | 0.00367 |
| R2 + R4 + R5 | 7.116 ohms | −0.59709 | 0.00291 | 0.00291 |
| R2 + R4 + R6 + R7 | 7.709 ohms | −0.64504 | 0.00496 | 0.00496 |
| R2 + R1 | 2.372 ohms | −0.20362 | −0.00362 | 0.00362 |
| R3 | 1.779 ohms | −0.15316 | −0.00316 | 0.00316 |
| R4 + R5 | 5.337 ohms | −0.45162 | −0.00162 | 0.00162 |
| R4 + R6 + R7 | 5.930 ohms | −0.50038 | −0.00038 | 0.00038 |
| R4 + R2 + R1 | 4.744 ohms | −0.40258 | −0.00258 | 0.00258 |
| R4 + R3 | 4.151 ohms | −0.35327 | −0.00327 | 0.00327 |
| R5 | 2.965 ohms | −0.25379 | −0.00379 | 0.00379 |
| R6 + R7 | 3.558 ohms | −0.30367 | −0.00367 | 0.00367 |
| R6 + R4 + R2 + R1 | 7.116 ohms | −0.59709 | 0.00291 | 0.00291 |
| R6 + R4 + R3 | 6.523 ohms | −0.54887 | 0.00113 | 0.00113 |
| R6 + R5 | 5.337 ohms | −0.45162 | −0.00162 | 0.00162 |
| R7 | 1.186 ohms | −0.10241 | −0.00241 | 0.00241 |

For the above table, the attenuation is determined using the following formula:

$$\text{Attenuation}(dB) = 20\ \log\left[\frac{2}{2 + (Z_t/Z_t)}\right]$$

The "$Z_1$" in the denominator of the above formula represents the impedance of the transmission line providing input signal 12. For the above table, $Z_1$ was set to 50 ohms. The Delta (dB) represents the variation from a defined attenuation step. For the above table, the resistance values were determined empirically so that attenuation steps of 0.05 decibels are defined. Therefore, the defined attenuation steps are 0.05 dB, 0.10 dB, 0.15 dB, 0.20 dB, and so on, continuing up to 0.65 dB. The Delta (dB) represents the actual variation from a defined attenuation step, and the ABS(dB) represents the absolute value of the Delta (dB). For the above table, Delta (dB) has an average value of −0.001203 dB, which represents an average error (with respect to the defined attenuation steps) of 2.41%.

While the above table defines the resistance values that result in stepped attenuation values of 0.05 decibels, by scaling the above-defined resistance values up or down, the attenuation step size can be increased or decreased respectively.

Shunt resistances R8 and R9 may be included to couple input terminal 22 and output terminal 62 (respectively) to ground. The use of shunt resistances allows for better impedance matching by reducing the portion of the input signal 12 that is reflected. For the above-described four-way 0.05 decibel attenuation step system, a typical value for shunt resistances R8 and R9 is 1,800 ohms.

Resistors R1–R9 may be discrete resistors that are attached to a printed circuit board. Alternatively, resistors R1–R9 may be formed by depositing resistive material on a semiconductor, dielectric, or insulating substrate.

Figure 2:
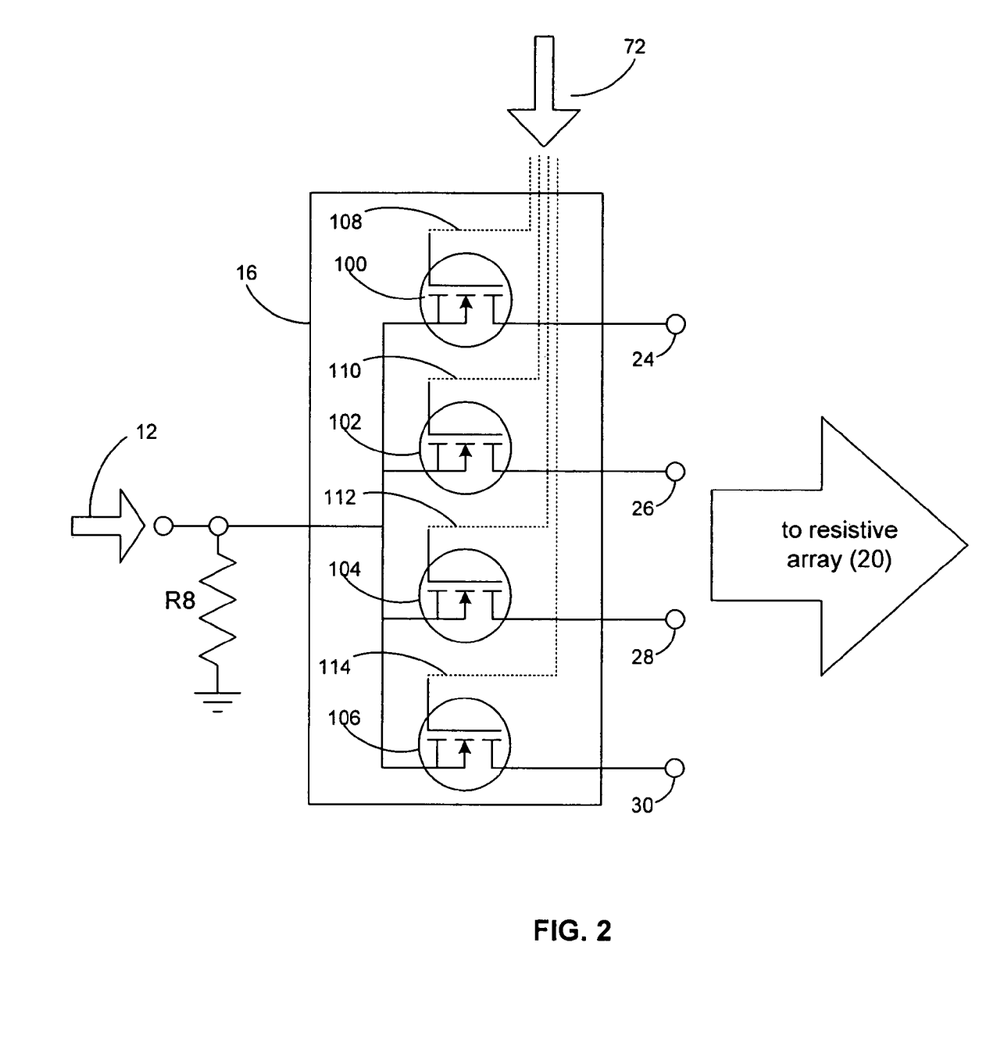
FIG. 2 is a schematic diagram of the switch of the variable attenuation device of FIG. 1.

Switches 16 and 18 are typically implemented using RF transistors. Referring to FIG. 2, an implementation of switch 16 is shown that includes four transistors 100, 102, 104 and 106, each of which is controlled with a separate control signal 108, 110, 112 and 114 (respectively) applied to the gate of the transistor. In this embodiment, control signal 72 is actually four separate signals, one of which controls the state of each transistor. Alternatively, a two bit bus may be used to select one of the four possible switch states. Accordingly, applying a gate voltage to a transistor controls the conductive state of the transistor. This, in turn, may allow input signal 12 to pass through the selected transistor and appear on the appropriate output terminal 24, 26, 28 or 30.

Transistors 100, 102, 104 and 106 may be discrete transistors attached to a printed circuit board or may be IC (i.e., integrated circuit) transistors that are formed in a semiconductor substrate. As is known in the art, RF switches (e.g., switch 16) may be constructed using both series and shunt transistors configurations.

Figure 3:
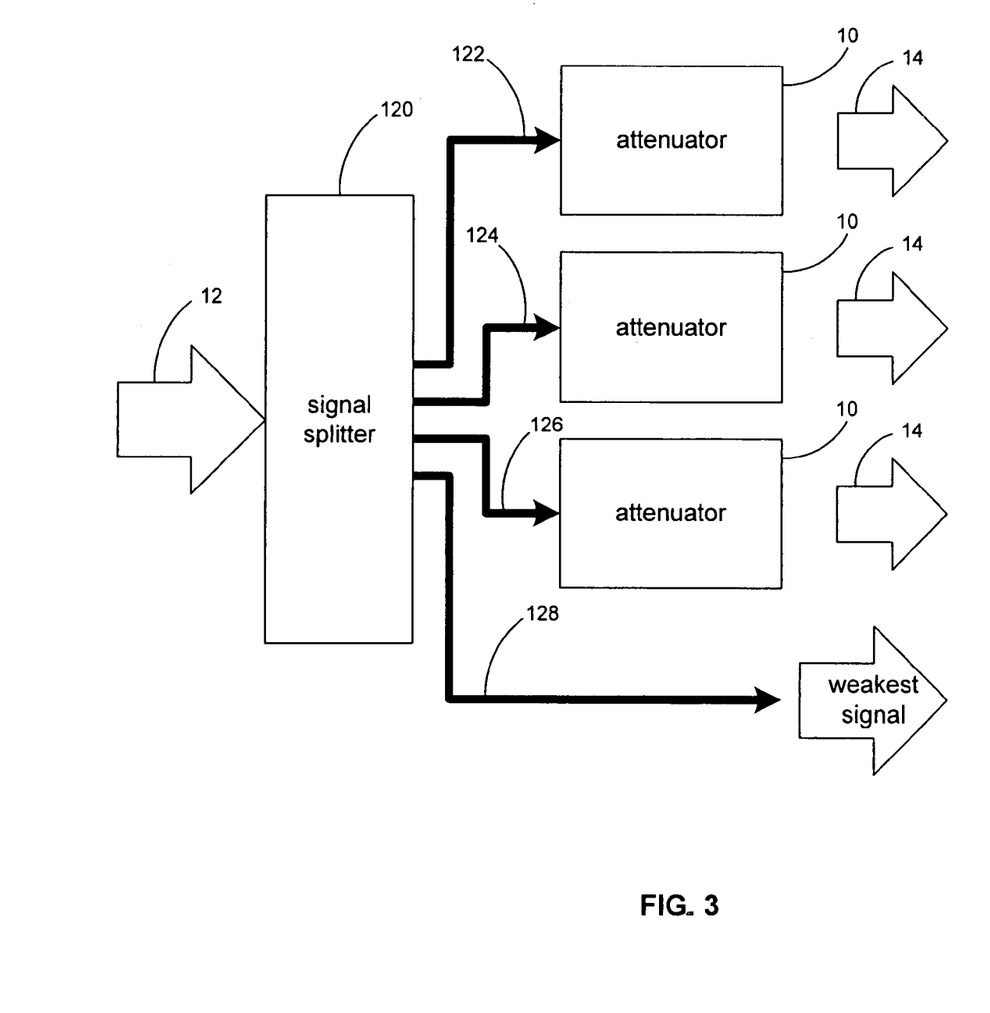
FIG. 3 is a block diagram of a signal splitting system including a signal splitter and an attenuator.

Referring to FIG. 3, there is shown variable attenuation device 10 being used in combination with a signal splitter 120. An example of signal splitter 120 is an RF6400 four port splitter module produced by the LTX Corporation of Westwood, Mass. Splitter 120 receives (on an input port) input signal 12 from a signal source (not shown) and provides (on output port) four essentially equal signals 122, 124, 126 and 128. However, due to variations and tolerances in the components used to couple splitter 120 and variable attenuation device 10 (three of which are shown), the strength of each of these signals typically varies. Accordingly, once a determination is made concerning which of the signals is the weakest (i.e., signal 128), a variable attenuation device 10 may be used to attenuate each of the other signals (i.e., signals 122, 124 and 126) to make them equal in strength to that of the weakest signal. Alternatively, a fourth attenuator (not shown) may be coupled to signal 128 to compensate for frequency-dependant signal strength variations.

Figure 4:
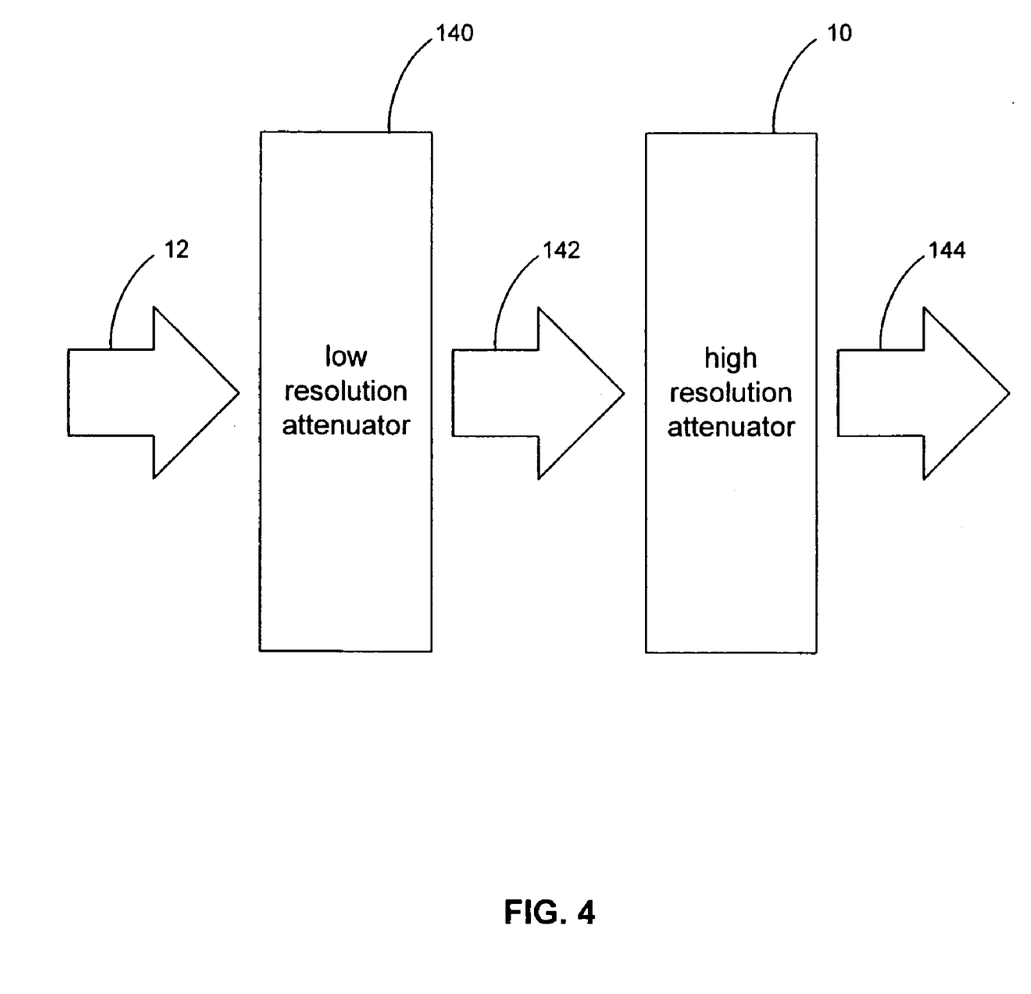
FIG. 4 is a block diagram of a signal attenuation system including a low-resolution attenuator and a high-resolution attenuator.

Referring to FIG. 4, there is shown a variable attenuation device 10 (i.e., a high-resolution attenuator) being used in series with a low resolution attenuator 140. Low resolution attenuator 140 (e.g., a voltage-variable attenuator, a PIN-diode attenuator, a switched-bit digital attenuator; described above) receives input signal 12 on an input port and provides (on an output port) a coarsely-attenuated signal 142 having attenuation steps in the range of 0.25–0.50 decibels. This coarsely-attenuated signal is provided to variable attenuation device 10 so that the signal can be "fine tuned" to generate a finely-attenuated output signal 144. By using the resistor values defined above for variable attenuation device 10, an attenuation resolution (i.e., attenuation step size) of 0.05 decibels is realized. Further, as described above, by equally scaling all of the resistor values down, a higher resolution (i.e., a smaller attenuation step size) can be achieved.

Figure 5:
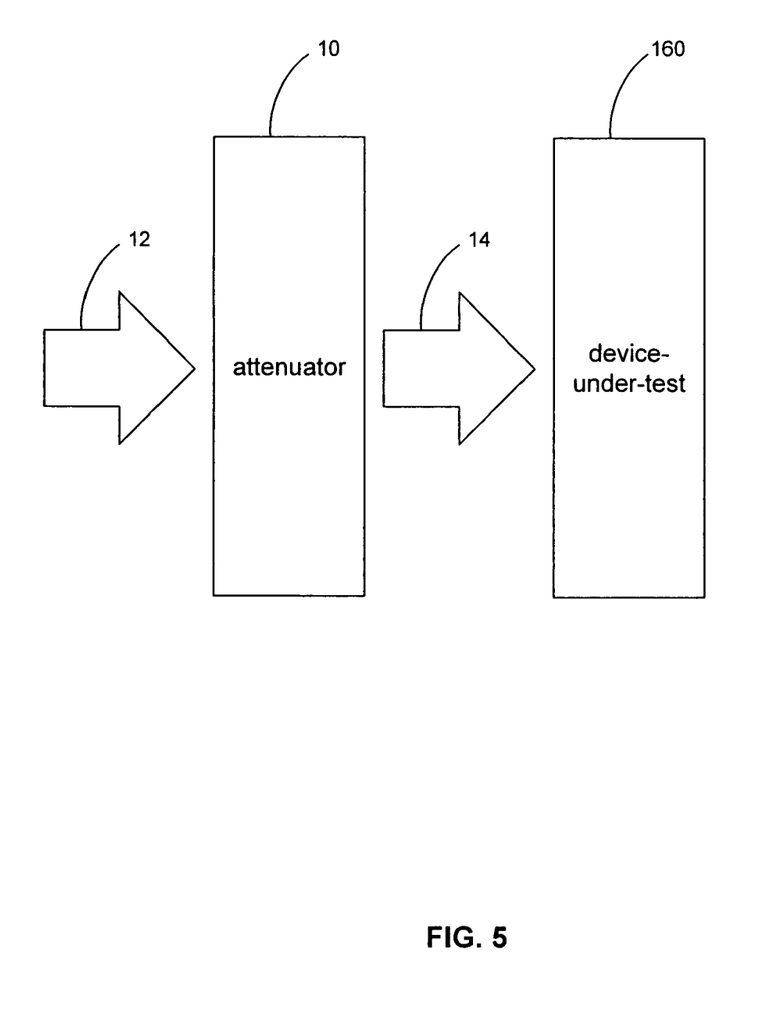
FIG. 5 is a block diagram of a testing system including an attenuator and a device-under-test.

Referring to FIG. 5, there is shown a variable attenuation device 10 being used to provide a test signal (i.e., attenuated output signal 14) to a device-under-test 160. Examples of device under test 160 include receiver circuits, down-converter mixers, and low-noise amplifiers. During use, input signal 12 is attenuated using variable attenuation device 10, generating attenuated output signal 14 that is provided to device-under-test 160.

While the resistive array is described above as including four input nodes and four output nodes, other configurations are possible. For example, since the number of nodes in the resistive array typically match the number of selectable outputs or inputs of the switch(es) of the system, the use of an "N"-way switch typically results in a resistive array having "N" input and output nodes.

While the first switch and the second switch are shown as four-way switches (i.e., having four outputs or four input), other configurations are possible (as described below).

Figure 6:
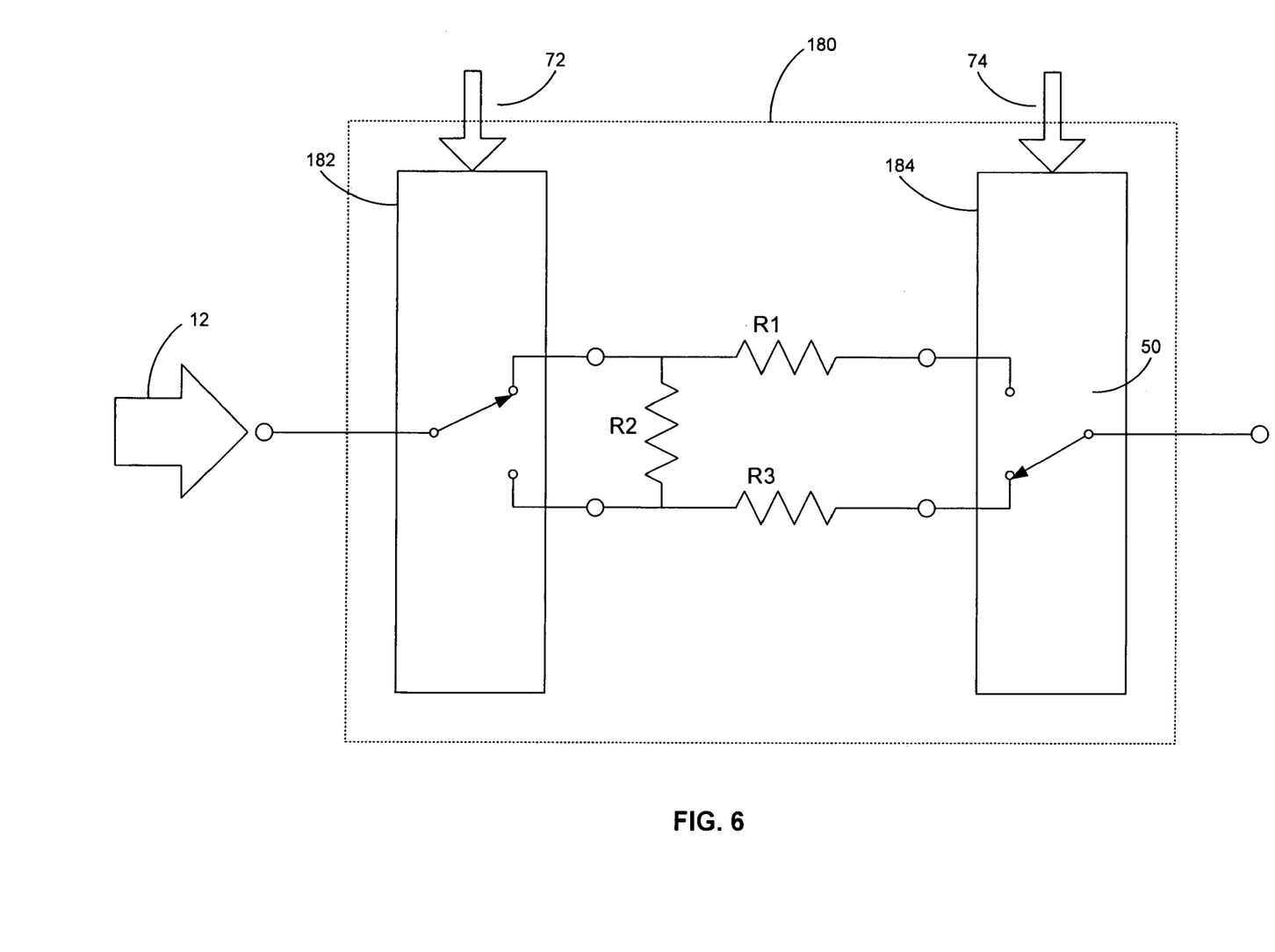
FIG. 6 is a block diagram of a series variable attenuation device including two-way switches.

Referring to FIG. 6, there is shown a variable attenuation device 180 that includes a pair of two-way switches 182 and 184, and three resistors R1–R3. As with the above described system, by varying the position of switches 182 and 184, the level of attenuation experienced by input signal 12 is controllable. Again, by carefully choosing the value of resistors R1–R3, substantially uniform attenuation steps can be achieved.

Concerning this two-way switch implementation, for a desired 0.05 dB attenuation step, assume the resistors are chosen as follows: R1 is 1.164 ohms; R2 is 1.164 ohms; and R3 is 0.582. As this particular implementation uses two-way switches, there are $2^2$ or four possible switch combinations.

| Path | Total Resistance ($Z_t$) | Attenuation (dB) | Delta (dB) | ABS value |
| --- | --- | --- | --- | --- |
| R1 | 1.164 ohms | −0.10052 | −0.00052 | 0.00052 |
| R2 + R3 | 1.746 ohms | −0.15035 | −0.00035 | 0.00035 |
| R2 + R1 | 2.328 ohms | −0.19989 | 0.00011 | 0.00011 |
| R3 | 0.582 ohms | −0.05041 | −0.00041 | 0.00041 |

As above, the attenuation is determined using the following formula:

$$\text{Attenuation}(db) = 20\ \log\left[\frac{2}{2 + (Z_t/Z_1)}\right]$$

Setting $Z_1$ equal to 50 ohms for this two-way switch system, the defined attenuation steps are 0.05 dB, 0.10 dB, 0.15 dB and 0.20 dB. Delta (dB) has an average value of −0.000290 dB, which represents an average error (with respect to the defined attenuation steps) of 0.58%.

Figure 7:
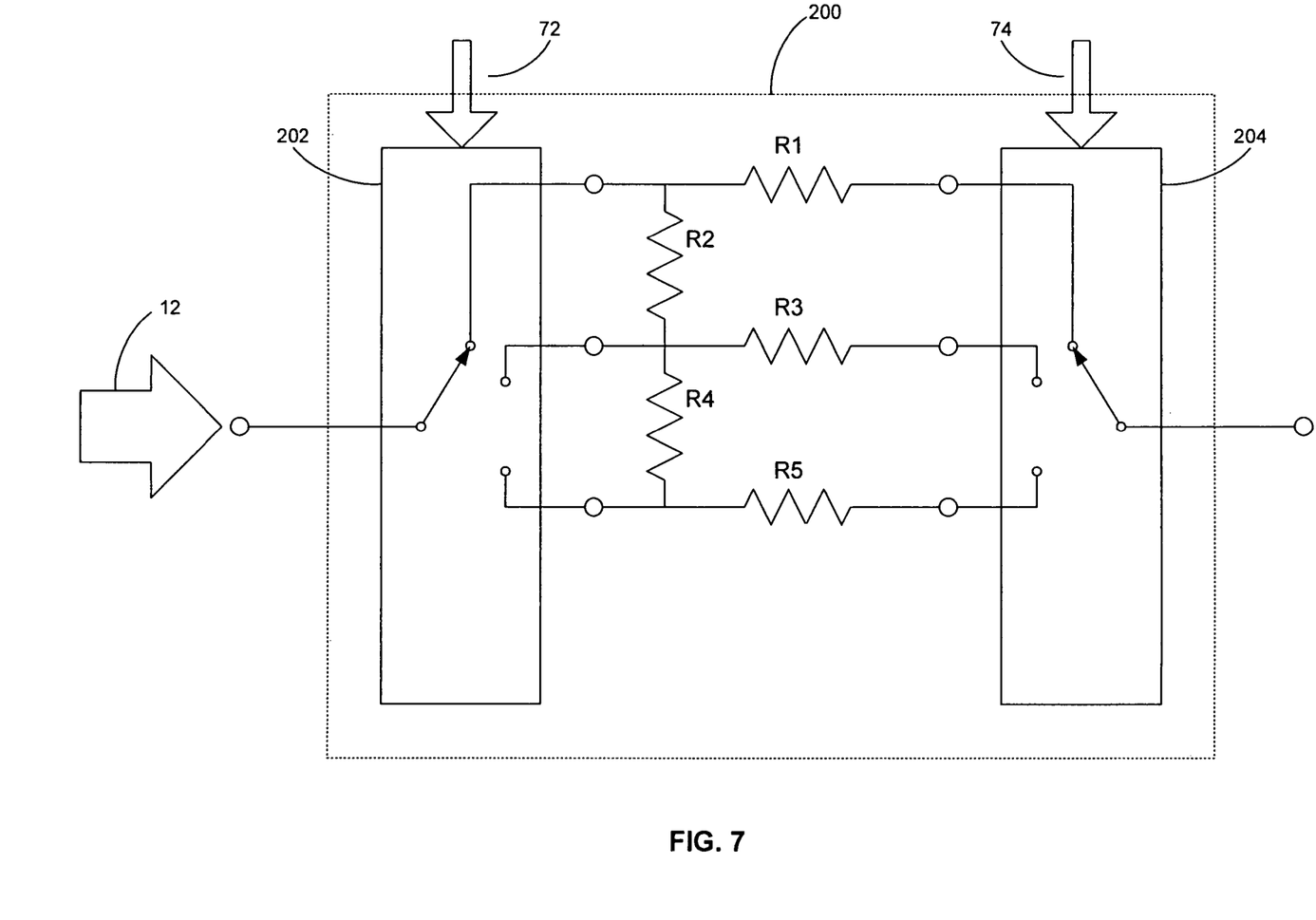
FIG. 7 is a block diagram of a series variable attenuation device including three-way switches.

Referring to FIG. 7, there is shown a variable attenuation device 200 that includes a pair of three-way switches 202 and 204, and five resistors R1–R5. As with the above described systems, by varying the position of switches 202 and 204, the level of attenuation experienced by input signal 12 is controllable. Again, by carefully choosing the value of resistors R1–R5, substantially uniform attenuation steps can be achieved.

Thus far, the desired attenuation step has been set to 0.05 dB. However, as stated above, this value can be increased or decreased as needed or desired. Concerning this three-way switch implementation, for a desired 0.10 dB attenuation step, assume the resistors are chosen as follows: R1 is 0.586 ohms; R2 is 2.344 ohms; R3 is 5.274 ohms; R4 is 1.172 ohms; and R5 is 0.586 ohms. As this particular implementation uses three-way switches, there are $3^2$ or nine possible switch combinations, some of which result in duplicate load impedances.

| Path | Total Resistance ($Z_t$) | Attenuation (dB) | Delta (dB) | ABS value |
| --- | --- | --- | --- | --- |
| R1 | 0.586 ohms | −0.05075 | −0.00075 | 0.00075 |
| R2 + R3 | 7.618 ohms | −0.63770 | 0.01230 | 0.01230 |
| R2 + R4 + R5 | 4.102 ohms | −0.34918 | 0.00082 | 0.00082 |
| R2 + R1 | 2.930 ohms | −0.25084 | −0.00084 | 0.00084 |
| R3 | 5.274 ohms | −0.44642 | −0.00358 | 0.00358 |
| R5 + R4 | 1.758 ohms | −0.15137 | −0.00137 | 0.00137 |
| R4 + R2 + R1 | 4.102 ohms | −0.34918 | 0.00082 | 0.00082 |
| R4 + R3 | 6.446 ohms | −0.54259 | 0.00741 | 0.00741 |
| R5 | 0.586 ohms | −0.05075 | −0.00075 | 0.00075 |

As above, the attenuation is determined using the following formula:

$$\text{Attenuation}(dB) = 20\ \log\left[\frac{2}{2 + (Z_l/Z_t)}\right]$$

Setting $Z_1$ equal to 50 ohms for this three-way switch system, the defined attenuation steps are 0.05 dB, 0.15 dB, 0.25 dB, 0.35 dB, 0.45 dB, 0.55 dB and 0.65 dB. Delta (dB) has an average value of 0.002357 dB, which represents an average error (with respect to the defined attenuation steps) of 2.36%.

Figure 8:
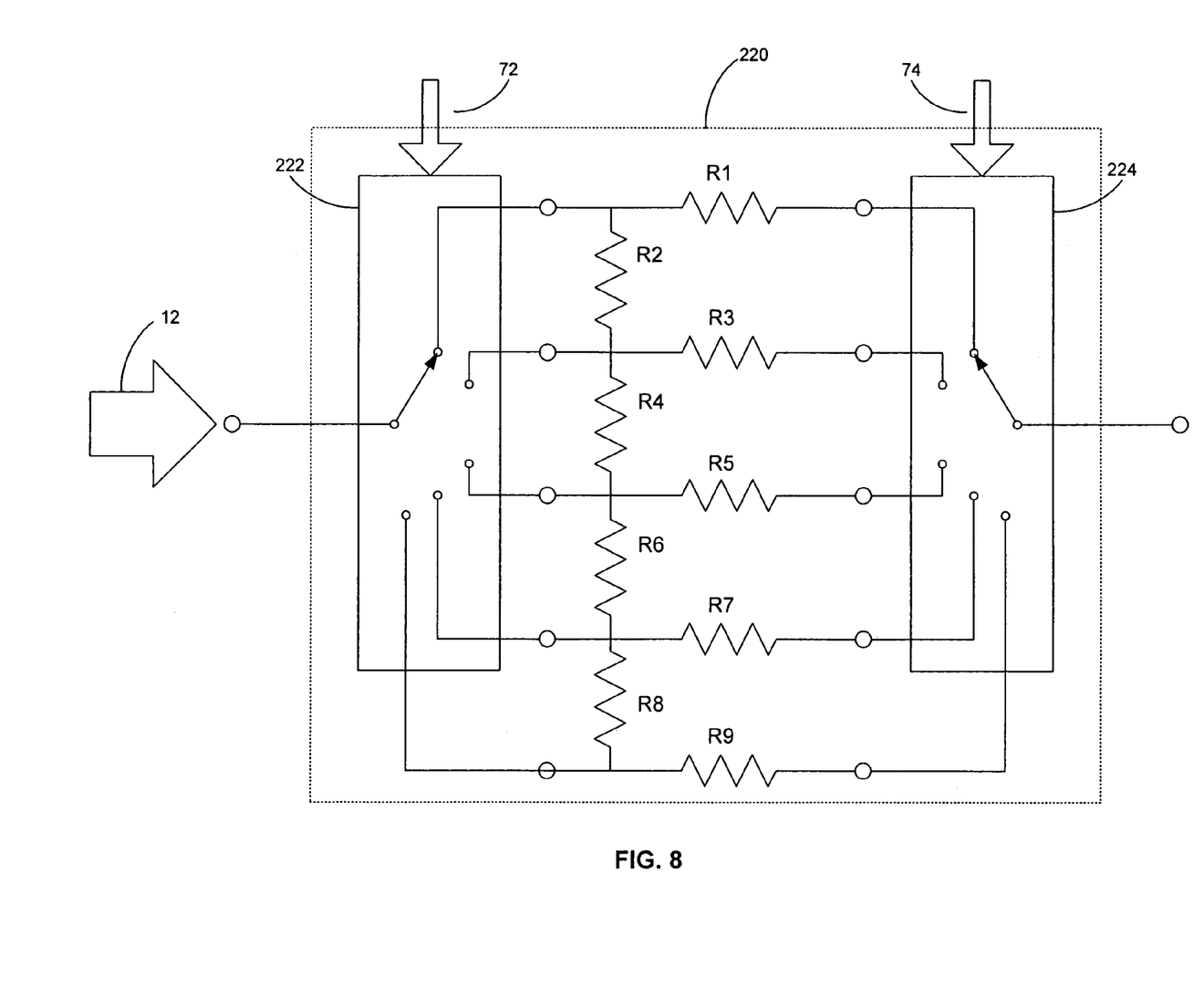
FIG. 8 is a block diagram of a series variable attenuation device including five-way switches.

Referring to FIG. 8, there is shown a variable attenuation device 220 that includes a pair of five-way switches 222 and 224, and nine resistors R1–R9. As with the above described systems, by varying the position of switches 222 and 224, the level of attenuation experienced by input signal 12 is controllable. Again, by carefully choosing the value of resistors R1–R9, substantially uniform attenuation steps can be achieved.

Concerning this five-way switch implementation, for a desired 0.05 dB attenuation step, assume the resistors are chosen as follows: R1 is 0.599 ohms; R2 is 2.396 ohms; R3 is 1.797 ohms; R4 is 1.180 ohms; R5 is 3.594 ohms; R6 is 1.797 ohms; R7 is 1.797 ohms, R8 is 1.797 ohms; and R9 is 0.599 ohms. As this particular implementation uses five-way switches, there are $5^2$ or twenty-five possible switch combinations, some of which result in duplicate load impedances.

| Path | Total Resistance ($Z_t$) | Attenuation (dB) | Delta (dB) | ABS value |
| --- | --- | --- | --- | --- |
| R1 | 0.599 ohms | −0.05187 | −0.00187 | 0.00187 |
| R2 + R3 | 4.193 ohms | −0.35677 | −0.00677 | 0.00677 |
| R2 + R7 + R4 | 5.391 ohms | −0.45607 | −0.00607 | 0.00607 |
| R2 + R7 + R5 + R6 | 9.584 ohms | −0.79494 | 0.00506 | 0.00506 |
| R2 + R7 + R5 + R8 + R9 | 10.183 ohms | −0.84229 | 0.00771 | 0.00771 |
| R2 + R1 | 2.995 ohms | −0.25632 | −0.00632 | 0.00632 |
| R3 | 1.797 ohms | −0.15470 | −0.00470 | 0.00470 |
| R7 + R4 | 2.995 ohms | −0.25632 | −0.00632 | 0.00632 |
| R7 + R5 + R6 | 7.188 ohms | −0.60292 | −0.00292 | 0.00292 |
| R7 + R5 + R8 + R9 | 7.787 ohms | −0.65133 | −0.00133 | 0.00133 |
| R7 + R2 + R1 | 4.792 ohms | −0.40656 | −0.00656 | 0.00656 |
| R7 + R3 | 3.594 ohms | −0.30669 | −0.00669 | 0.00669 |
| R4 | 1.198 ohms | −0.10344 | −0.00344 | 0.00344 |
| R5 + R6 | 5.391 ohms | −0.45607 | −0.00607 | 0.00607 |
| R5 + R8 + R9 | 5.990 ohms | −0.50530 | −0.00530 | 0.00530 |
| R5 + R7 + R2 + R1 | 8.386 ohms | −0.69946 | 0.00054 | 0.00054 |
| R5 + R7 + R3 | 7.188 ohms | −0.60292 | −0.00292 | 0.00292 |
| R5 + R4 | 4.792 ohms | −0.40656 | −0.00656 | 0.00656 |
| R6 | 1.797 ohms | −0.15470 | −0.00470 | 0.00470 |
| R8 + R9 | 2.396 ohms | −0.20566 | −0.00566 | 0.00566 |
| R9 | 0.599 ohms | −0.05187 | −0.00187 | 0.00187 |
| R8 + R6 | 3.594 ohms | −0.30669 | −0.00669 | 0.00669 |
| R8 + R5 + R4 | 6.589 ohms | −0.55425 | −0.00425 | 0.00425 |
| R8 + R5 + R7 + R3 | 8.985 ohms | −0.74733 | 0.00267 | 0.00267 |
| R8 + R5 + R7 + R2 + R1 | 10.183 ohms | −0.84229 | 0.00771 | 0.00771 |

As above, the attenuation is determined using the following formula:

$$\text{Attenuation}(dB) = 20\ \log\left[\frac{2}{2 + (Z_l/Z_t)}\right]$$

Setting $Z_1$ equal to 50 ohms for this five-way switch system, the defined attenuation steps are 0.05 dB, 0.10 dB, 0.15 dB, 0.20 dB, 0.25 dB, and so on, continuing up to 0.85 dB. Delta (dB) has an average value of −0.002934 dB, which represents an average error (with respect to the defined attenuation steps) of 5.87%.

While, thus far, the variable attenuation devices have been described as being used in a series configuration (with respect to the input signal), other configurations are possible. For example, the variable attenuation devices may be used in a shunt configuration.

Figure 9:
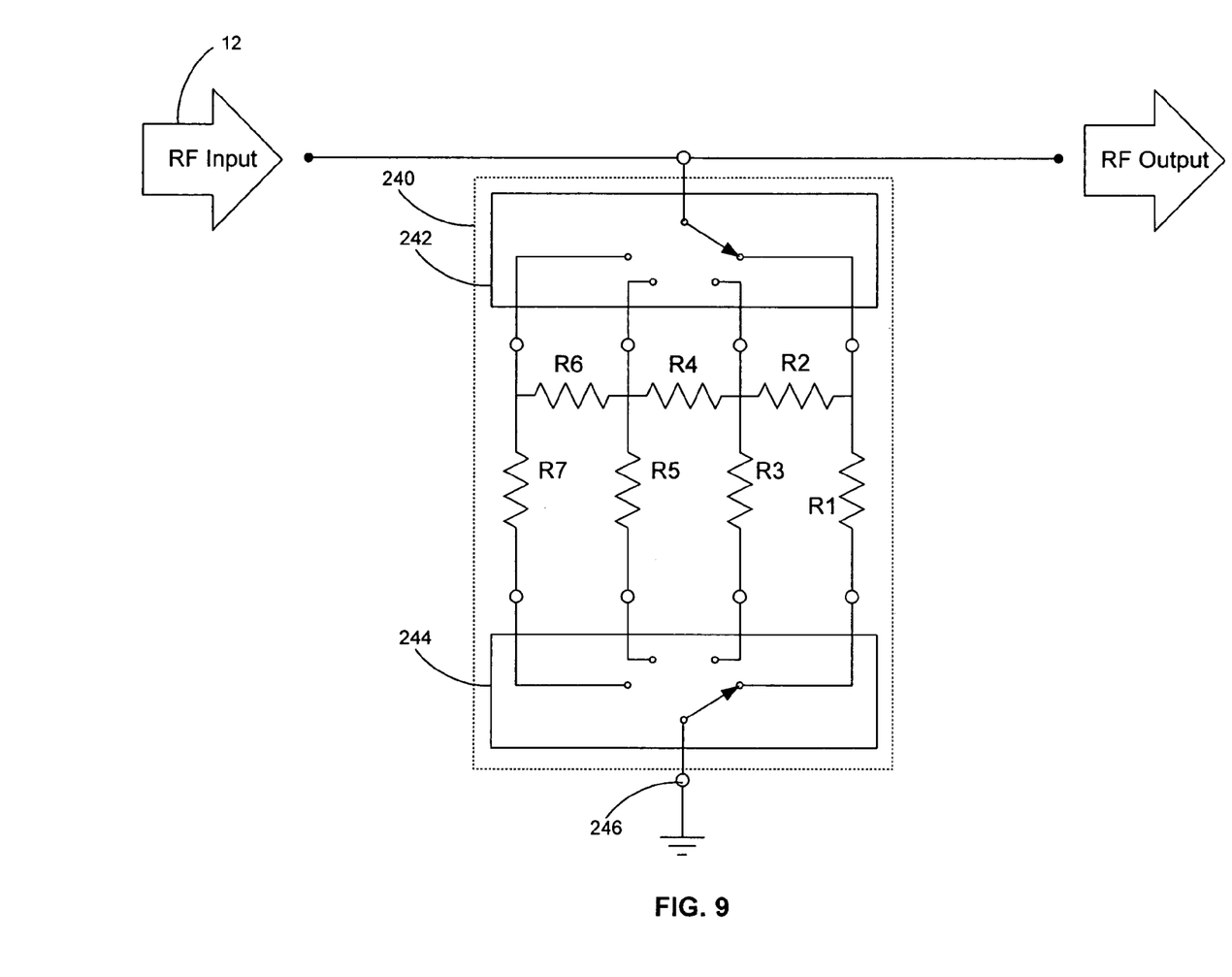
FIG. 9 is a block diagram of a dual-switch shunt variable attenuation device.

Referring to FIG. 9, there is shown a dual-switch shunt variable attenuation device 240 that includes a pair of four-way switches 242 and 244 and seven resistors R1–R7. While schematically similar to the dual-switch series variable attenuation device of FIG. 1, the output terminal 246 of the shunt device 240 is tied to ground. Therefore, by varying the position of switches 242 and 244, the shunt load experienced by input signal 12 is varied, resulting in a variation of the attenuation experienced by input signal 12. As above, by carefully choosing the value of resistors R1–R7, substantially uniform attenuation steps can be achieved.

Figure 10:
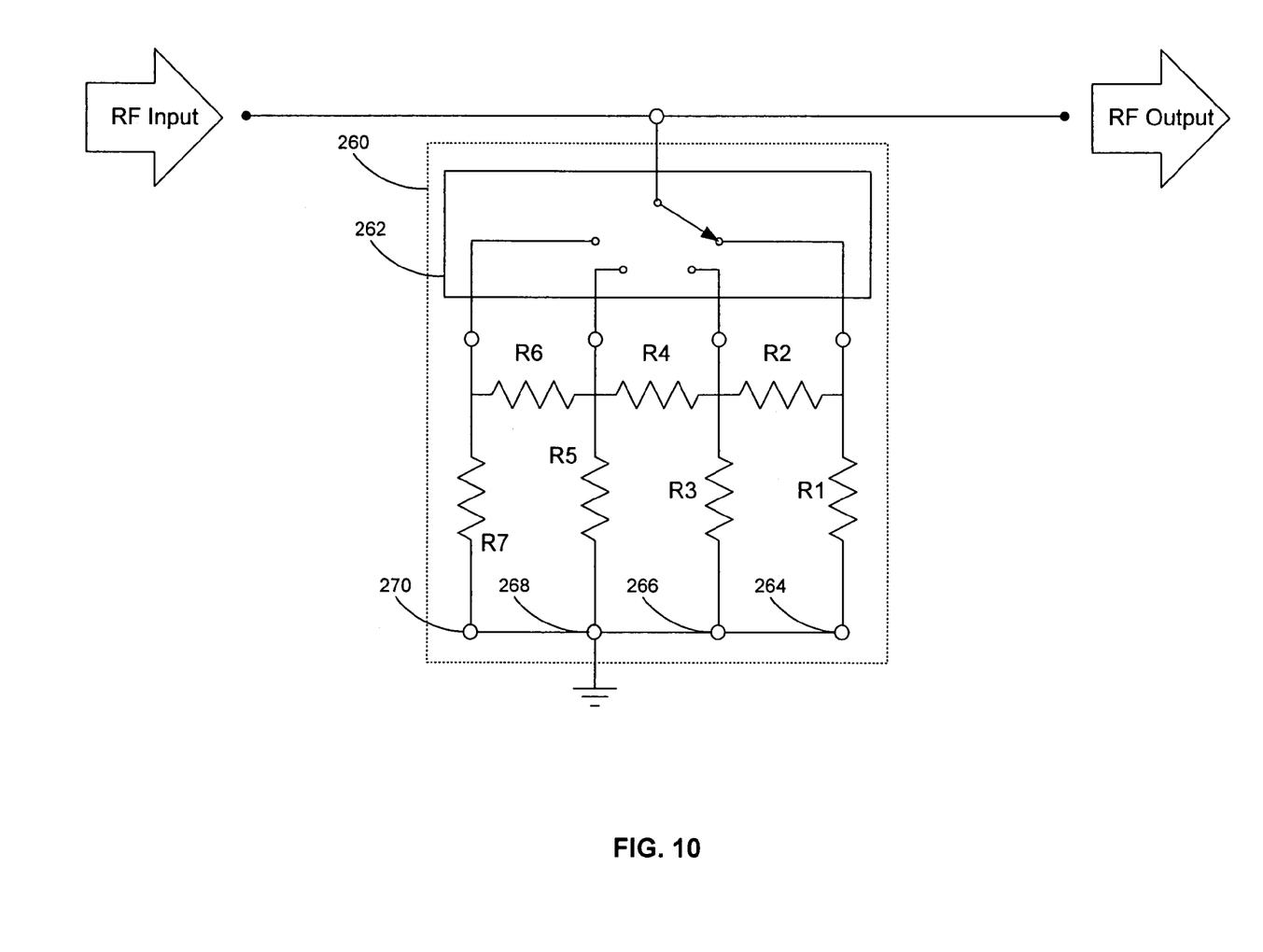
FIG. 10 is a block diagram of a single-switch shunt variable attenuation device.

Referring to FIG. 10, there is shown a single-switch shunt variable attenuation device 260. While schematically similar to the dual-switch shunt variable attenuation device of FIG. 8, only a single switch 262 is used and, therefore, the output nodes 264, 266, 268 and 270 are tied to ground. Therefore, by varying the position of switch 262, the shunt load experienced by the input signal is varied, resulting in a variation of the attenuation experienced by the input signal. As above, by carefully choosing the value of resistors R1–R7, substantially uniform attenuation steps can be achieved. However, while this configuration has a reduced parts count, as there is only one switch, the maximum number of shunt loads is never greater than the number of switch positions for switch 262.

While the system is described above as separate components (e.g., two switches and a resistor array), other configurations are possible. For example, the entire device may be formed on a single integrated circuit chip.

A number of implementations have been described. Nevertheless, it will be understood that various modifications may be made. Accordingly, other implementations are within the scope of the following claims.

What is claimed is:

1. A series variable attenuation device comprising:
   a resistive array having two or more input nodes, two or more output nodes, a first set of two or more resistive devices, each of said resistive devices of said first set coupling one of said input nodes with an associated one of said output nodes; and
   a second set of one or more resistive devices, each resistive device of said second set coupling one of said input nodes with another of said input nodes;
   a first switch having an input terminal and two or more selectable output terminals; wherein the input terminal is configured to receive an input signal and the two or more selectable output terminals are coupled to the two or more input nodes of the resistive array; and
   a second switch having two or more selectable input terminals and an output terminal; wherein the output terminal is configured to provide an attenuated output signal and the two or more selectable input terminals are coupled to the two or more output nodes of the resistive array;
   wherein the output terminal selected on the first switch and the input terminal selected on the second switch varies the resistance seen by the input signal, and the values of the resistive devices are configured to allow for substantially-uniform attenuation steps of the input signal.

2. The device of claim 1 wherein the first switch includes a discrete switching device coupled to each of the selectable output terminals.

3. The device of claim 2 wherein each discrete switching device includes one or more transistors.

4. The device of claim 3 wherein the transistor is a discrete transistor.

5. The device of claim 3 wherein the transistor is formed in a semiconductor substrate.

6. The device of claim 1 wherein the second switch includes a discrete switching device coupled to each of the selectable input terminals.

7. The device of claim 6 wherein each discrete switching device includes one or more transistors.

8. The device of claim 7 wherein the transistor is a discrete transistor.

9. The device of claim 7 wherein the transistor is formed in a semiconductor substrate.

10. The device of claim 1 wherein the input signal is an RF signal.

11. The device of claim 1 wherein the resistive devices are discrete resistors.

12. The device of claim 1 wherein the resistive devices are formed with resistive material deposited on one of a semiconductor substrate, a dielectric substrate, and an insulating substrate.

13. The device of claim 1 wherein the resistive array is a planar resistive array.

14. The device of claim 13 wherein the planar resistive array is formed with resistive material deposited on one of a semiconductor substrate, a dielectric substrate, and an insulating substrate.

15. The device of claim 1 further comprising:
    a first shunt resistance for coupling the input terminal of the first switch to a ground; and
    a second shunt resistance for coupling the output terminal of the second switch to the ground.

16. The device of claim 1 wherein at least one of the resistive devices of the resistive array connects one of the input nodes to one of the output nodes of the resistive array.

17. The device of claim 1 wherein the first and second switches are reflective switches.

18. A dual-switch shunt variable attenuation device comprising:
    a resistive array having two or more input nodes, two or more output nodes, a first set of two or more resistive devices, each of said resistive devices of said first set coupling one of said input nodes with an associated one of said output nodes; and
    a second set of one or more resistive devices, each resistive device of said second set coupling one of said input nodes with another of said input nodes;
    a first switch having an input terminal and two or more selectable output terminals; wherein the input terminal is configured to receive an input signal and the two or more selectable output terminals are coupled to the two or more input nodes of the resistive array; and
    a second switch having two or more selectable input terminals and an output terminal; wherein the output terminal is coupled to a ground and the two or more selectable input terminals are coupled to the two or more output nodes of the resistive array;
    wherein the output terminal selected on the first switch and the input terminal selected on the second switch varies the resistance seen by the input signal, and the values of the resistive devices are configured to allow for substantially-uniform attenuation steps of the input signal.

19. The device of claim 18 wherein the first switch includes a discrete switching device coupled to each of the selectable output terminals.

20. The device of claim 19 wherein each discrete switching device includes one or more transistors formed in a semiconductor substrate.

21. The device of claim 18 wherein the second switch includes a discrete switching device coupled to each of the selectable input terminals.

22. The device of claim 21 wherein each discrete switching device includes one or more transistors formed in a semiconductor substrate.

23. The device of claim 18 wherein the input signal is an RF signal.

24. The device of claim 18 wherein the resistive array is a planar resistive array.

25. The device of claim 24 wherein the planar resistive array is formed with resistive material deposited on one of a semiconductor substrate, a dielectric substrate, and an insulating substrate.

26. The device of claim 18 wherein at least one of the resistive devices of the resistive array connects one of the input nodes to one of the output nodes of the resistive array.

* * * * *